United States Patent [19]

Hoeberechts et al.

[11] Patent Number: 4,722,852

[45] Date of Patent: Feb. 2, 1988

[54] DEVICE FOR ELECTRON EMISSION INCLUDING DEVICE FOR PROVIDING WORK FUNCTION REDUCING LAYER AND METHOD OF APPLYING SUCH A LAYER

[75] Inventors: Arthur M. E. Hoeberechts; Henricus A. M. van Hal; Harm Tolner; Gerardus G. P. van Gorkom, all of Eindhoven, Netherlands

[73] Assignee: U.S. Philips Corporation, New York, N.Y.

[21] Appl. No.: 52,294

[22] Filed: May 21, 1987

Related U.S. Application Data

[62] Division of Ser. No. 743,221, Jun. 10, 1985, Pat. No. 4,709,185.

[30] Foreign Application Priority Data

Jun. 13, 1984 [NL] Netherlands ........................ 8401866

[51] Int. Cl.[4] ............................................ C23C 14/00

[52] U.S. Cl. ...................................... 427/78; 427/124; 427/248.1; 427/250; 427/252

[58] Field of Search ................. 427/78, 124, 252, 250, 427/248.1; 313/346 R, 550

[56] References Cited

U.S. PATENT DOCUMENTS

| | | | |
|---|---|---|---|
| 4,303,930 | 12/1981 | Van Gorkom | 357/13 |
| 4,370,797 | 2/1983 | Van Gorkom | 29/569 R |
| 4,651,052 | 3/1987 | Hoeberechts | 313/446 |

*Primary Examiner*—Richard R. Bueker
*Attorney, Agent, or Firm*—John C. Fox

[57] ABSTRACT

An electron-emitting surface is provided with a material reducing the electron work function, which is obtained from a suitable reaction. The reaction mixture or the product to be decomposed, for example $CsN_3$, is present in a surface depression of a semiconductor body, while one or more pn junctions act as a heating diode. Upon heating, cesium is released and deposited on the electron-emitting surface.

9 Claims, 3 Drawing Figures

DEVICE FOR ELECTRON EMISSION INCLUDING DEVICE FOR PROVIDING WORK FUNCTION REDUCING LAYER AND METHOD OF APPLYING SUCH A LAYER

This is a division of application Ser. No. 743,221, filed June 10, 1985, now U.S. Pat. No. 4,709,185.

BACKGROUND OF THE INVENTION

The invention relates to a device comprising an electron-emitting body and means for coating an electron-emitting surface of the body with a layer of a material reducing the electron work function of the surface, the body and means located in an envelope which is evacuated or filled with an inert protective gas. Coating is accomplished by means of a decomposition reaction of a suitable material or by heating a mixture, in which the material reducing the electron work function is released and deposited on the electron-emitting surface.

The electron-emitting body may be a thermionic cathode or a semiconductor cathode; in the latter case, various kinds of semiconductor cathodes may be used, such as NEA cathodes, field emitters and especially reverse-biased junction cathodes as described in U.S. Pat. Nos. 4,303,930 and 4,370,797, assigned to the present Assignee. Vacuum tubes containing such cathodes tubes are suitable to be used as camera or display tubes, but may also be used in apparatus for Auger spectroscopy, electron microscopy and electron lithography.

The relevant device may also be provided with a photocathode, in which event incident radiation gives rise to an electron current which leaves the photocathode. Such photocathodes are used in photocells, camera tubes, images converters and photomultiplier tubes.

Another application of a device according to the invention is the so-called thermionic converter, in which thermal radiation is converted into an electron current.

An inert protective gas is to be understood herein to mean a gas which does not adversely influence the decomposition reaction which occurs, for example, upon heating the mixture. The quantity of protective gas present in the envelope can be slightly varied under the influence of the reaction, in which the material reducing the work function is released, as will appear below.

The invention further relates to a method of applying a thin layer of a material reducing the electron work function of an electron-emitting surface of an electron-emitting body in an evacuated space or a space filled with an inert protective gas, the material reducing the electron-work function being obtained by a decomposition reaction or heating of a suitable mixture.

Such a method is known from Netherlands Patent Specification No. 18,162. In this case, cesium is deposited in a discharge tube by heating a dissolved mixture of cesium chloride and barium oxide so that the cesium chloride is reduced by the released barium to metallic cesium, which spreads over the interior of the discharge tube. In an embodiment shown in the said Patent Specification, the mixture to be heated is provided in a lateral branch of the vacuum tube which is sealed from this take afterward.

Although mention is made in the said Patent Specification of the possibility to provide the mixture at areas in the discharge tube other than in a lateral tube, there is no indication about the manner in which this could be achieved.

A possible solution is to heat cesium chromate together with a reduction agent (silicon or zirconium) on a resistance tape of tantalum in the vacuum by passing a current through the said resistance tape, which leads to the desired heating. In practice, however, a number of problems then arise.

Firstly, problems arise due to the use of tantalum as resistance material for heating purposes. In order to obtain a sufficient power for the reduction of the cesium chromate (about 1 to 2 W), it is required in practice that electric currents of a few Amperes are passed through the resistance tape. In a number of applications, for example Auger spectroscopy, electron microscopy and electron lithography, in which substantially all elements are operated at a high voltage, this often means that an additional transformer is required. The current moreover has to be passed to the resistance tape via supply wires and lead-through pins; in view of the high currents, these lead-through pins have a diameter of 0.5 to 1 mm. The disadvantage of such thick lead-through pins in vacuum tubes is generally known.

Disadvantages also arise from the use of cesium chromate and the reduction reaction to which it is subjected. This reaction cannot easily be controlled and may sometimes even lead to an explosion. From this reaction, moreover, a considerable number of by-products, such as water vapour ($H_2O$), carbon dioxide ($CO_2$) and cesium oxide ($Cs_2O$) are obtained. The comparatively high temperature at which the reaction takes place (about 725° C.) not only gives rise to the said high power required to heat the resistance tape, but also results in an unfavourable ratio between the quantity of pure cesium and, for example, cesium oxide in the released gas mixture. The ratio of the vapour pressure of pure cesium to that of cesium oxide in fact rapidly decreases with increasing temperature. A possible solution to this problem is the removal of residual products via overdistillation by pumping and allowing released cesium to be deposited on a cooling surface, after which it is spread again by careful heating. However, this solution comprises a number of steps (such as cooling, for example by a Peltier element, and heating again), which are preferably avoided in high-vacuum, high-voltage applications.

The invention has for its object to provide a device of the kind mentioned in the opening paragraph, in which the said problems are substantially avoided.

In addition, the invention has for its object to provide a method in which an electron-emitting surface can be coated in a controlled manner with a layer of material reducing the electron work function of the surface.

SUMMARY OF THE INVENTION

According to one aspect of the invention, an electron-emitting device of the kind described in the opening paragraph is characterized in that it further comprises a semiconductor device which acts as both a carrier for the mixture or the material to be decomposed and a heating element.

According to another aspect of the invention, a method is characterized in that a mixture or a material to be decomposed is placed in or on a semiconductor body which forms both a carrier for the mixture or the material to be decomposed and a heating element, and heated to bring about a reaction, as a result of which the material reducing the electron-work function is released and is deposited on the surface of the electron-emitting body.

The invention is based on the recognition of the fact that the use of a semiconductor body both as a carrier and as a heating element offers the possibility to obtain the desired power with comparatively small currents (about 50 mA) by means of elements formed in the semiconductor body, such as, for example, diodes.

Moreover, the semiconductor body can be provided in such a form, for example with a despression, that it can serve as a container for the material to be decomposed or the mixture.

An advantage of a device according to the invention is that due to the relatively small current, the semiconductor device can readily be connected via connection conductors and electric lead-throughs in the tube, which have a relatively small diameter. Another advantage is that due to this small current, a separate transformer is unnecessary.

Preferably, the material to be decomposed is cesium azide ($CsN_3$) since during the decomposition reaction substantially only inert nitrogen is released in addition to cesium. Moreover, the relevant decomposition reaction takes place at so low a temperature (about 300° C.) that the vapour pressure of cesium oxide ($Cs_2O$) that may be formed is low with respect to that of cesium. In addition, this temperature is sufficiently high to enable the whole device may be baked out, if desired, without initiating the decomposition reaction. Another advantage is the good controllability of the reaction, as a result of which a metered quantity of cesium can be supplied.

Although the use of a decomposition reaction of cesium azide yields very satisfactory results as to the supply of cesium and the growth of monolayers of cesium, particularly on semiconductor cathodes, problems may arise with the semiconductor body used as a container and a heating element, respectively. For example, the metals usual in semiconductor technology for external connections, such as aluminium and gold, are in fact not very resistant to direct contact with cesium azide and cesium, respectively. Due to an electrochemical reaction the cesium azide has an etching effect on aluminium, while cesium converts gold into a porous form.

This could be prevented by choosing less usual metals, such as silver or platinum, for the connection conductors. An attractive alternative solution is to envelope the connection wires at least in part with a protective material which is not attacked by the azide or the cesium, such as, for example, silicon nitride or silicon oxynitride.

A preferred embodiment of an electron-emitting device according to the invention is characterized in that the semiconductor device has at a surface a depression which constitutes the said container. In the case in which the semiconductor body consists of silicon and the depression contains cesium azide, the depression is coated with silicon oxide, while the surface is coated with silicon nitride.

BRIEF DESCRIPTION OF THE DRAWINGS

The invention will now be described more fully with reference to the drawing, in which:

FIG. 1 shows diagrammatically in cross-section a device according to the invention, while

DESCRIPTION OF THE PREFERRED EMBODIMENTS

Figure 1:
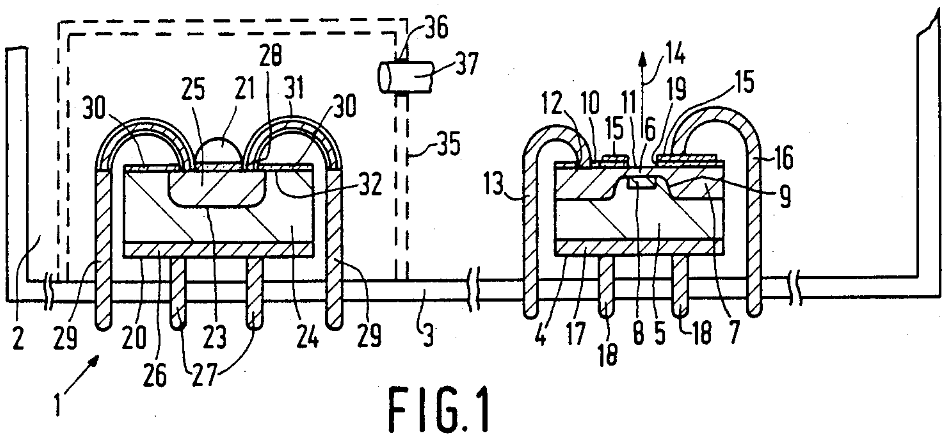

The Figures are schematic and not drawn to scale. For the sake of clarity in the cross-sections some of the dimensions especially in the direction of thickness are greatly exaggerated. Semiconductor zones of the same conductivity type are generally cross-hatched in the same direction; corresponding parts are generally designated by the same reference numerals.

FIG. 1 shows a device 1 according to the invention, in this case a vacuum tube 2 having an end wall 3 on which a semiconductor cathode 4 is secured. The semiconductor cathode 4 is of a type as described in U.S. Pat. Nos. 4,303,930 and 4,370,797, assigned to the present Assignee and comprises a p-type substrate 5, in which n-type regions 6, 7 are formed, as well as a region 8 having a high acceptor concentration, which is provided, for example, by ion implantation. As a result, the semiconductor cathode 4 has a pn junction 9 having a reduced breakdown voltage at the area of the regions 6,8. The n-type region 7 is highly doped for contacting purposes and is connected through a contact hole 12 in a layer 10 of insulating material, for example silicon oxide, covering the surface 11 of the cathode to a connection conductor 13. In order to generate an electron current 14 at the area of the opening 19 in the oxide 10, the pn junction 9 is biased in the reverse direction in a manner such that avalanche multiplication occurs therein. The n-type region 6 is chosen to be sufficiently thin so that a large part of the generated electrons can leave the semiconductor body. For obtaining an additional acceleration, an acceleration electrode 15 is disposed on the oxide 10 around the opening 19, which, depending upon the application, may be, for example, circular, rectangular or polygonal. The acceleration electrode 15 can be connected via the connection conductor 16 to the desired voltage so that the electrons forming the electron current 14 are subjected to an additional acceleration at right angles to the surface 11. The p-type substrate 5 is contacted on its lower side, as the case may be via an additional highly doped p-type zone, by means of the metallization 17, which is in turn provided with connection conductors 18. The connection conductors 13,16,18 are passed in a vacuum-tight manner through the end wall 3 of the vacuum tube 2. For a more detailed description of the cathode 4, reference may be made to U.S. Pat. Nos. 4,303,930 and 4,370,797, assigned to the present Assignee.

The electrons generated in the semiconductor body leave the surface 11 at the area of the opening 19 in the insulating layer 10. In order to reduce the work function, the surface 11 is covered with a layer of material reducing the work function, such as cesium, which is preferably provided in the form of an extremely thin layer which need have a thickness of only one atom.

During use, this layer of cesium may be lost, however, for example due to the etching action of positive ions left behind in the vacuum tube 2 or formed during use. With thermionic cathodes, such a layer of material reducing the work function can be lost gradually by evaporation.

In order to compensate for this loss of cesium during use, but also in order to apply, as the case may be, an initial layer of cesium, the device 1 according to the invention further comprises a semiconductor body 20, which acts as a carrier or container for a quantity of cesium acid 21. Upon heating, the cesium azide is decomposed into nitrogen and cesium, which is deposited on the surface 11. If nitrogen is used as the protective gas, the released nitrogen will substantially not influence the overall quantity of nitrogen, while also in high-vacuum applications this released nitrogen, inter alia due to its inert behaviour, has a substantially negligible influence on the operation of the cathode and that of the whole device, respectively.

The semiconductor body 20 comprises a p-type substrate 24, in which an n-type region 25 is formed, for example by diffusion. The semiconductor body 20 now has a pn junction 23 between the p-type substrate 24 and the n-type region 25 and therefore can act as a heating diode. For contacting purposes, the substrate 24 is provided on its lower side with a metallization 26 and one or more connection conductors 27, while the n-type region 25 is connected through contact holes 28 in a layer 30 of insulating material (for example silicon oxide) provided on the surface 32 to connection conductors 29.

Heating takes place by operating the diode formed by the pn junction 23 preferably in the reverse direction. If breakdown occurs, the current through the diode increases, depending upon the diode characteristics, to, for example, approximately 50 mA at approximately 20 V. The then dissipated power of approximately 1 W is sufficient to cause the cesium azide 21 to be decomposed at least in part into cesium and nitrogen.

In the present embodiment, the semiconductor body 20 is not mounted against the tube wall 3 so that no heat conduction via this wall is possible and therefore substantially the whole quantity of dissipated power is utilized for the heating and decomposition, respectively, of the azide. The required current (approximately 50 mA) is considerably smaller than when a resistance tape is used as a heating element so that the lead-throughs of the connection conductors 27,29 have a cross-section which is considerably (20 to 40 times) smaller.

The semiconductor body 20 may be situated, if desired, in an envelope 35 shown diagrammatically in FIG. 1, which is provided with one or more openings 36 for the released cesium. In order to give this cesium a preferential direction when it leaves the envelope 35, in this embodiment a pipe 37 is provided in the opening 36. The cesium is now not or substantially not deposited on undesired areas, while moreover due to the fact that the residence time of the cesium in the envelope 35 is longer, the azide 21 is consumed less rapidly. Besides, possible substances released during the decomposition reaction now remain for the major part in the envelope 35.

The cesium azide 21 present on the layer 30 will melt due to heat dissipation in the semiconductor body 20, the molten azide readily spreading over the layer 30 where silicon oxide is chosen for this layer 30. The molten azide gets into contact with the connection conductors 29 at the area of the contact holes 28. Aluminum or gold may be chosen for the connection conductors 29. In the case in which the connection conductors consist of aluminium, they are attacked by the molen azide due to electrochemical etching. Gold becomes porous under the influence of cesium so that the connection conductors 29 soon become useless. In the device of FIG. 1, this is avoided in that a protective material layer 31 is applied over at least part of the connection conductors. In the present embodiment, this material is silicon nitride, to which cesium azide does not substantially adhere. In the alternative, metals are chosen which are insensitive to attack by azide or cesium, such as, for example, silver or platinum, making protective layer 31 unnecessary.

Figure 2:
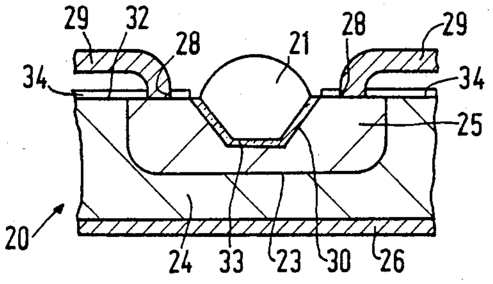
FIG. 2 shows diagrammatically in cross-section a semiconductor body for use in such a device.

FIG. 2 shows in cross-section another embodiment of the semiconductor body 20, which is now provided with a depression for the azide 21. The bottom and the walls of the depression are covered with a silicon oxide layer 30, over which, after heating, the molten azide flows readily, while the remaining surface 32 is covered with silicon nitride 34, to which the molten azide does not readily adhere. Thus, the molten azide remains substantially completely in the depression 33, which can be obtained by means of an etching treatment in which the silicon nitride 34 is used as a mask. The connection conductors 29 may be covered with a protective layer such as layer 31 shown in FIG. 1.

Figure 3:
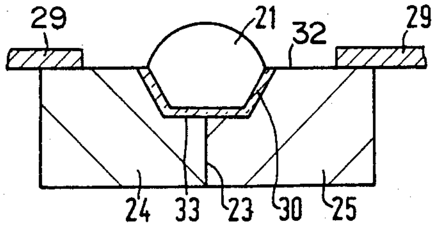
FIG. 3 shows a modification of the semiconductor body shown in FIG. 2.

FIG. 3 shows a modification of semiconductor body 20, in which the connection conductors 29 contact the major surface 32. This modification may be of advantage if such a semiconductor device is mounted in an arrangement with cold cathodes in the manner shown in U.S. Pat. No. 4,651,052, assigned to the present Assignee.

Of course the invention is not limited to the embodiments described above. In the embodiment shown in FIG. 1, the semiconductor cathode 4 may be replaced, for example, by a filament cathode, while the semiconductor body 20 may also be accommodated together with other electron-emitting bodies, such as, for example, photocathodes or photomultipliers, in vacuum space 2. The conductivity types of the semiconductor regions in the semiconductor body 20 may be reversed. Furthermore, several diodes may be formed in series (or parallel) in one semiconductor body. The semiconductor body 20 may also act as a heating element for other products to be decomposed or mixtures from which cesium or another material reducing the work function is released, such as the said chromates, or the mixture of potassium, cesium or rubidium salts and azide mentioned in Netherlands Patent Application No. 18162. Moreover, the quantity of cesium evolved may be metered. For example, if the intensity of the electron beam decreases below a certain limit due to loss of cesium at the emitting area, a new dose of cesium may be provided by heating the semiconductor body 20.

What is claimed is:

1. A method of coating an electron-emitting surface with a layer of material reducing the electron work function of the surface, the surface located in an envelope which is evacuated or filled with an inert protective gas, the method comprising heating a source of the material located in the envelope, whereby the material is released from the source and deposited on the electron-emitting surface, characterized in that the source is placed on a semiconductor device located in the envelope, the device comprising a semiconductor body and electrical leads, and further characterized in that the source is heated by supplying current to the semiconductor device.

2. The method of claim 1 in which the semiconductor body has a pn junction and the semiconductor device is a diode.

3. The method of claim 1 in which the semiconductor body has a surface depression for the source.

4. The method of claim 1 in which the material reducing the electron work function is cesium, and is released during the decomposition of cesium azide.

5. The method of claim 4 in which the leads of the semiconductor device are covered with a protective layer.

6. The method of claim 5 in which the protective layer is selected from silicon nitride and silicon oxynitride.

7. The method of claim 1 in which the semiconductor device is situated within a substantially closed space in the envelope, the space having at least one outlet opening for the material reducing the electron work function.

8. The method of claim 1 in which the layer of the material reducing the electron work function is a monolayer.

9. The method of claim 1 in which the thickness of the layer of the material reducing the electron work function is varied by varying the current supplied to the semiconductor device.

* * * * *